(12) United States Patent
Buescher et al.

(10) Patent No.: US 8,380,147 B2
(45) Date of Patent: Feb. 19, 2013

(54) POWER AMPLIFIER CIRCUIT WITH MEANS FOR TUNING WAVE SHAPE OF ASK RF SIGNAL ENVELOPE, AND METHOD FOR IMPLEMENTING THE POWER AMPLIFIER CIRCUIT

(75) Inventors: Kevin Scott Buescher, Colorado Springs, CO (US); Michal Prokes, Jesenice (CZ)

(73) Assignee: EM Microelectronic-Marin S.A., Marin (CH)

( * ) Notice: Subject to any disclaimer, the term of this patent is extended or adjusted under 35 U.S.C. 154(b) by 99 days.

(21) Appl. No.: 13/080,344

(22) Filed: Apr. 5, 2011

(65) Prior Publication Data
US 2012/0256690 A1    Oct. 11, 2012

(51) Int. Cl.
*H04B 1/04* (2006.01)
*H03G 3/30* (2006.01)
*H03F 3/21* (2006.01)

(52) U.S. Cl. ............. 455/127.3; 455/108; 330/124 R; 330/127; 330/296

(58) Field of Classification Search .......... 455/102, 455/103, 108, 127.1, 127.2, 127.3; 330/124 R, 330/127, 136, 278, 296
See application file for complete search history.

(56) References Cited

U.S. PATENT DOCUMENTS

| 6,838,944 B2 * | 1/2005 | Franca-Neto ............... 330/305 |
| 7,940,125 B2 * | 5/2011 | Wang ........................ 330/311 |
| 2003/0199255 A1 * | 10/2003 | Arisawa .................... 455/108 |
| 2011/0070848 A1 * | 3/2011 | Ramachandra Reddy . 455/127.2 |

* cited by examiner

*Primary Examiner* — Blane J Jackson
(74) *Attorney, Agent, or Firm* — Griffin & Szipl, P.C.

(57) ABSTRACT

A power amplifier circuit can be linked to an antenna arrangement of a communication system for transmission of ASK RF data signals. The power amplifier circuit includes an amplifier core with several cascode amplifier cells in parallel. Each cascode amplifier cell is composed of three NMOS transistors in triode mounting between an output terminal connected to the antenna arrangement, and an earth terminal. A first transistor of each cascode amplifier cell is controlled by a carrier frequency signal, whereas a second transistor of each cascode amplifier cell is controlled by a smoothing control loop in order to modulate data to be transmitted on carrier frequency by amplitude shift keying. The smoothing control loop is provided for generating an increasing gate voltage for the second transistors on the basis of an increasing current ramp from a first minimum current value to a second maximum current value during a "0" to "1" data transition. The smoothing control loop is provided for generating a decreasing gate voltage for the second transistors on the basis of a decreasing current ramp from the second maximum current value to the first minimum current value during a "1" to "0" data transition for shaping the envelope of ASK RF data signals to be transmitted.

21 Claims, 3 Drawing Sheets

POWER AMPLIFIER CIRCUIT WITH MEANS FOR TUNING WAVE SHAPE OF ASK RF SIGNAL ENVELOPE, AND METHOD FOR IMPLEMENTING THE POWER AMPLIFIER CIRCUIT

FIELD OF THE INVENTION

The present invention generally relates to RF power devices, in particular to power amplifier circuits adapted for accurately wave shaping of the envelope of ASK RF signals to be transmitted. Said power amplifier circuit of a RF power device can be used in a communication system.

The present invention concerns also the method for implementing the power amplifier circuit.

BACKGROUND OF THE INVENTION

In the field of communication systems and due to governmental requirements (for example ETSI, FCC), the RF spectral bandwidth of transmitters has generally to be limited. Many ways can be provided for that such as in particular lower output power, lower data rates, baseband data encoding, modulation techniques and controlling data transitions. The use of amplitude shift keying (ASK) modulation is inherently wide bandwidth, and it is often necessary to reduce said bandwidth. A solution for that can consist on limiting edge transition data rate in order to reduce higher order harmonics, but nothing is described for that in the prior art. With high efficiency transmitters, which use class-C amplifier, it is more difficult to achieve this given that said transmitters are not linear.

It can be proposed also for example to insert a cap between the gate and drain terminals of an NMOS power amplifier driver. A drawback of such an arrangement is to decrease the efficiency somewhat and to be not flexible for controlling the shape of the edge ramp at power amplifier output. This is hard to optimize the edge rate for all possible data rates, which are used by multipurpose transmitters. Based-band waveform shaping is difficult to use in class-C type transmitters due to non-linearities in the output.

We can cite the U.S. Pat. No. 7,560,989 B2, which describes a power amplifier circuit with controlled output power. Said power amplifier circuit is shown in part in FIGS. 1 and 2. The power amplifier circuit includes first of all, a power amplifier core 1 to be connected to an antenna assembly 30 shown in dotted lines, at the output terminal PA_$_{OUT}$. The power amplifier core 1 is composed of parallel amplifier cells A, B, C, D, E1, E4, connected between an earth terminal and the output terminal PA_$_{OUT}$. Said amplifier cells are preferably cascode amplifier cells, which are each composed with two series connected NMOS transistors N1" and N3". A power controller 12 of the power amplifier circuit selects a combination of amplifier cells to activate. The desired power level is determined by a codeword, which defines the combination of amplifier cells to be activated and adjustments of the current and voltage references if needed. In order to activate an amplifier cell, the gate of a second transistor N3" is controlled by a high level voltage of a supply voltage source, for example to the battery voltage not shown. Each combination of activated amplifier cells defines a predetermined attenuation level of the power amplifier output signal, so that it may be attenuated in a stepwise manner according to the selected combination.

Figure 1:
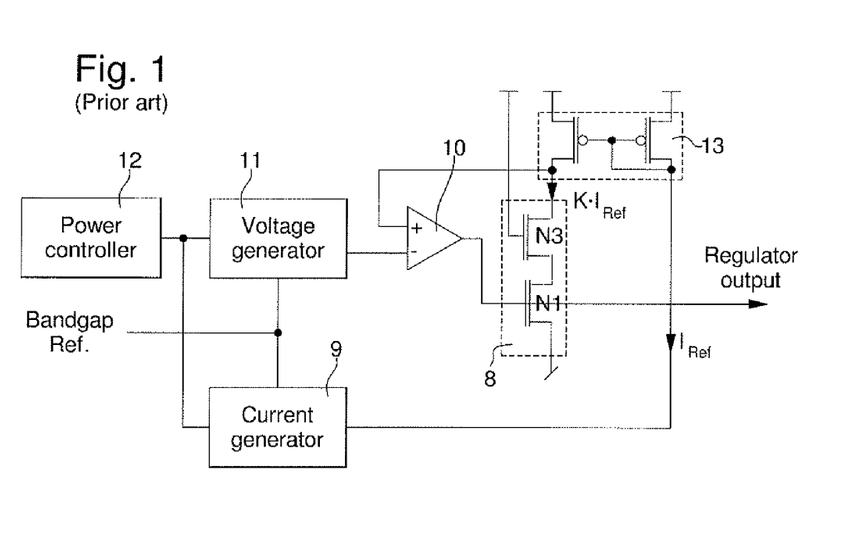
FIG. 1, already cited, shows the voltage regulator arrangement of a power amplifier circuit of the prior art.

The power amplifier circuit still includes a replica cell 8, similar to any of amplifier cells of the amplifier core 1, a current generator 9 and a voltage generator 11. Said current generator 9 and voltage generator 11 are connected to the power controller 12. The current generator 9 provides a reference current $I_{Ref}$, and the voltage generator 11 provides a reference voltage. The reference current and the reference voltage are generated internally using a band-gap reference. However, another method would be to use an external resistor for example to obtain a more precise and/or flexible solution.

The reference current $I_{Ref}$ can be mirrored in the replica 8 by a current mirror 13. The replica cell is advantageously a cascode amplifier cell comprising two transistors NMOS N1 and N3 connected in a cascode arrangement, where transistor N1 is present to limit the voltage on N3. The current $K \cdot I_{Ref}$ flowing through the replica cell corresponds to the reference current $I_{Ref}$ mirrored in the current mirror 13 with an adequate coefficient K. By monitoring and controlling the current through replica cell 8 a proportional current is to be expected to flow through amplifier core 1, namely the cascode amplifier cells. The related currents $I_A$, $I_B$, $I_C$, $I_D$, $I_{E1}$, $I_{E4}$ can be flowed through the cascode amplifier cells, if they are all activated. This is accomplished by using a feedback circuit around the replica. This feedback loop comprises the voltage regulator 10 to fix the top voltage of replica cell 8 to a reference voltage provided by a voltage generator 11.

Figure 2:
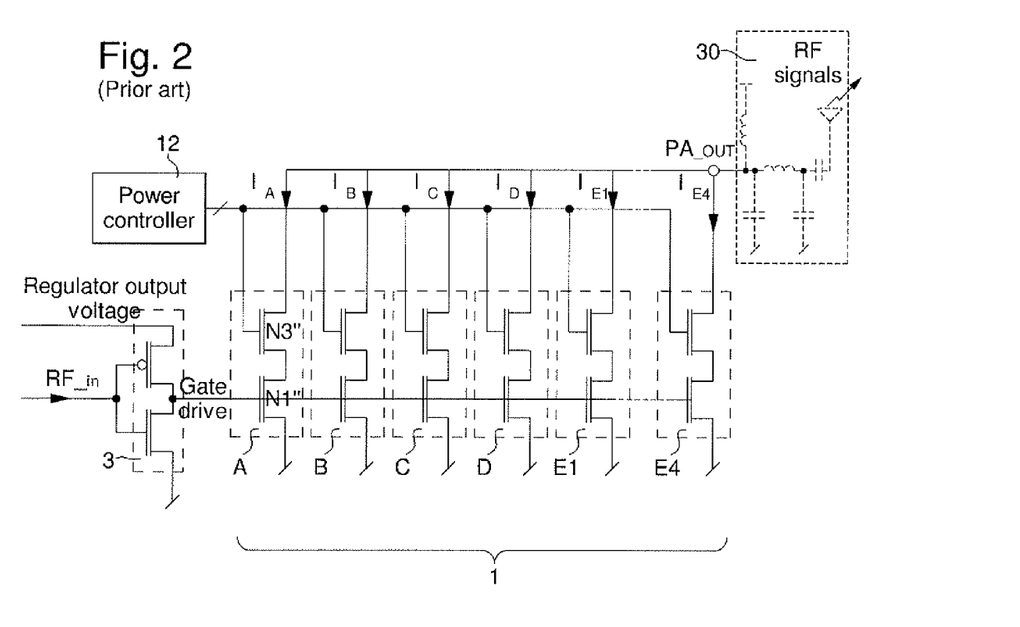
FIG. 2, already cited, shows the core arrangement of the power amplifier circuit of the prior art.

The regulator 10, namely in this example an operational trans-conductance amplifier (OTA), is used to fix the voltage at the top of the replica cell 8 to a selected reference voltage $V_{Ref}$ provided by the voltage generator 11. The power controller 12 is used to adjust both the selected voltage reference and the selected current reference of the current generator. The output of the regulator voltage known as the regulator output voltage is then distributed to provide the supply voltage for the inverter preamplifier 3 as shown in FIG. 2. Said inverter 3 receives in input a signal RF_in and the output of the inverter is connected to all the gates of the first NMOS transistors N1" of the cascode amplifier cells A, B, C, D, E1, E4. Said signal RF_in is a signal with a carrier frequency for the RF signals to be transmitted, but the ASK modulation of said signal RF_in is obtained by turning on and off the regulator, which supplies said inverter 3. Said ASK modulation is generally an ON-OFF keying. As already mentioned and will be seen later on again, the main power control is accomplished by switching in parallel a combination of selected amplifier cells to define a rough attenuation. In addition, to more finely adjust the attenuation of the power amplifier output signal, the current generator advantageously delivers several different current levels, e.g. four current levels, under request of the power controller allowing such fine attenuation step. Thus the power amplifier output signal may be attenuated in a fine stepwise manner, by controlling the current flowing through the replica device so that it causes the regulator voltage to adjust its output voltage until it equalizes this current. In summary this current level adjusts the supply voltage reference for the inverter.

With such a power amplifier circuit shown in part in FIGS. 1 and 2, the output power can be adapted as a function of the selected cascode amplifier cells, which are controlled by the power controller 12. The reference current and the reference voltage can be also adapted by the power controller in order to optimize performances such as transmission range for the ASK RF signals transmitted by the antenna. However nothing is provided for reducing the bandwidth, if ASK modulation RF signals have to be transmitted with any transition data rate.

SUMMARY OF THE INVENTION

It is thus a main object of the invention to provide a power amplifier circuit which overcomes the drawbacks of the prior art in order to limit edge transition data rate for reducing higher order harmonics.

The invention therefore concerns a power amplifier circuit intended to be linked to an antenna arrangement of a communication system for transmission of ASK RF data signals. The power amplifier circuit includes:

an amplifier core with at least one cascode amplifier cell, which is composed of at least two transistors in series connected between an output terminal for being connected to the antenna arrangement, and an earth terminal;

a first transistor of the cascode amplifier cell being controlled by a carrier frequency signal, whereas a second transistor of the cascode amplifier cell is controlled by a smoothing control loop in order to modulate data to be transmitted on carrier frequency by amplitude shift keying, wherein said smoothing control loop is provided for generating a gate voltage for the second transistor on the basis of an increasing or decreasing current ramp from a first current value to a second current value during a data transition for shaping the envelope of ASK RF data signals to be transmitted.

Some particular embodiments of the power amplifier circuit are defined in the dependent claims 2 to 18.

One advantage of the power amplifier circuit of the present invention lies in the fact that it can be easily changed the edge rate smoothing to be a fixed portion of the data stream period as well as well control the edge shape even when using a non-linear power amplifier core while maintaining good power efficiency.

A second transistor of each cascode amplifier cell is controlled by a gate voltage of the smoothing control loop, which depends on a current ramp supplied by a smoothing ramp current generator during each data transition. An increasing current is supplied during the "0" to "1" data transition, whereas a decreasing current is supplied during the "1" to "0" data transition. The time of data transition is so adapted through the smoothing control loop in order to be less than 1% to over 20%, for example 5, 10 or 20% of the period of data to achieve good spectral performance.

Another object of the present invention concerns a method for implementing the power amplifier circuit, which includes parallel cascode amplifier cells, a smoothing control loop in which is a replica cascode amplifier cell made similar to those of said amplifier core, and a smoothing ramp current generator to supply a current ramp to the smoothing control loop during each data transition. The method including the steps of:

generating an increasing or decreasing current ramp in the smoothing ramp current generator during a data transition, and supplying the current ramp to the smoothing control loop, which is provided for generating a gate voltage for a second transistor of each cascode amplifier cells on the basis of the increasing or decreasing current ramp from a first current value to a second current value during the data transition for shaping the envelope of ASK RF data signals to be transmitted.

Some particular steps of the method are defined in the dependent claims 20 and 21.

BRIEF DESCRIPTION OF THE DRAWINGS

Other aspects, features and advantages of the present invention will be apparent upon reading the following detailed description of non-limiting examples and embodiments made with reference to the accompanying drawings, in which.

DETAILED DESCRIPTION OF THE INVENTION

The following description concerns specifically a power amplifier circuit with means for accurately wave shaping of the envelope of ASK RF data signals to be transmitted by an antenna arrangement connected to the power amplifier circuit. Said power amplifier circuit of a transmitter device allows programmable edge transitions for transmission of ASK RF data signals that can be set to best match the desired data rate. Said power amplifier circuit allows eliminate fast edge rates, which generates many harmonics increasing the RF occupied bandwidth of the transmitter device. As explained hereafter, a good compromise is to have the edge transition in ASK RF data signals, for being easy to be demodulated with inexpensive receiver devices. An OOF keying modulation can be also considered as an ASK modulation with a voltage at 0 V for the "0" state of data to be transmitted.

Figure 3:
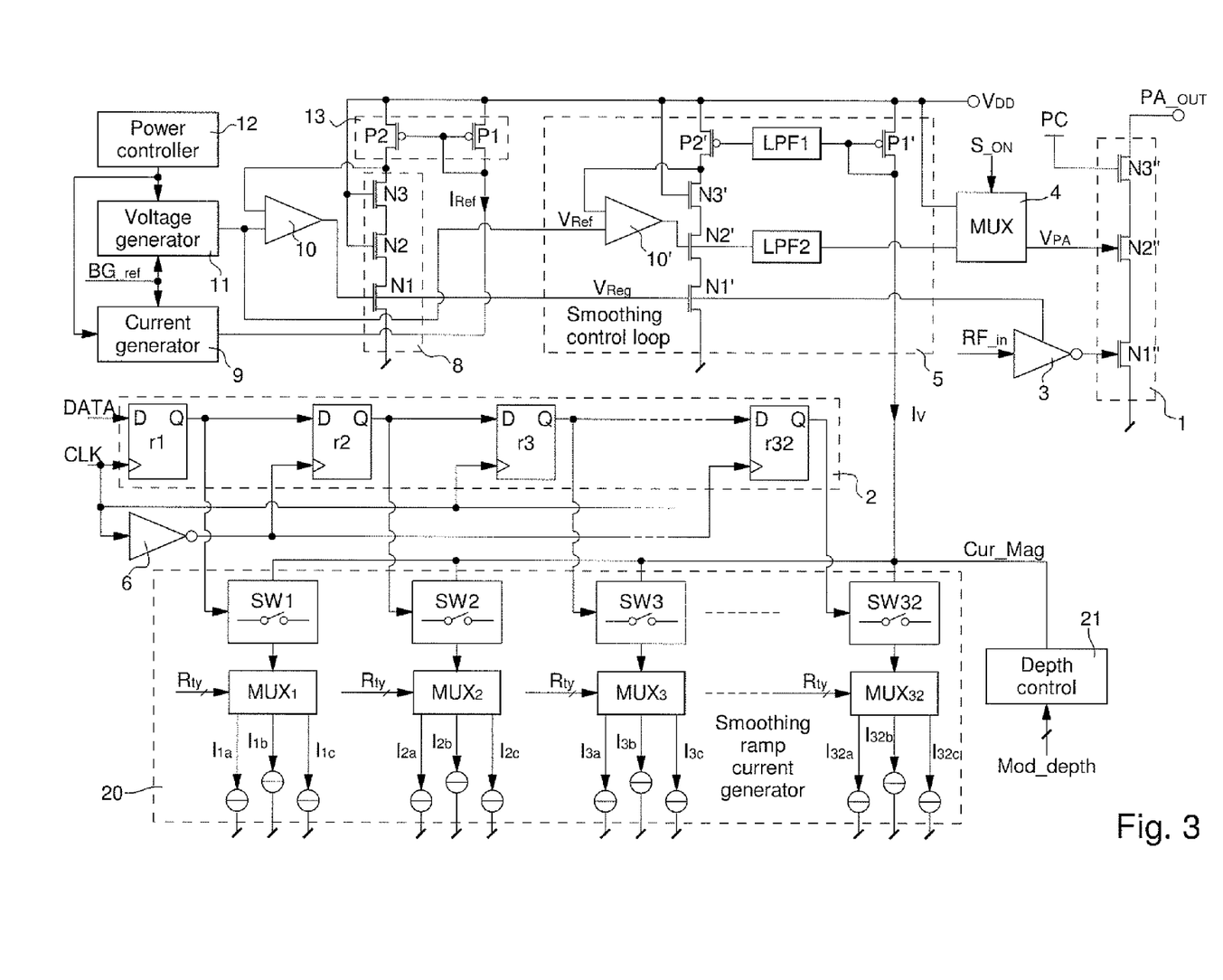
FIG. 3 shows in a simplified manner, the power amplifier circuit of the present invention.

As shown in FIG. 3, the power amplifier circuit of the present invention includes first of all an amplifier core 1, which is connected between an output terminal $PA_{OUT}$ and an earth terminal. Said amplifier core 1 can include at least one cascode amplifier cell, which is composed of at least two transistors N1", N2" in series connected between the output terminal $PA_{OUT}$ and the earth terminal. Said two transistors N1" and N2" can be two NMOS transistors. The amplifier core 1 in operation with at least one cascode amplifier cell, functions as a class-C type amplifier by pulling current from a load, during a portion of one period of the output carrier frequency signal. The load includes an inductance of an antenna arrangement as shown in dotted lines in FIG. 2. The inductance is connected to a high level voltage terminal $V_{DD}$ of a battery for example, not shown.

Preferably said amplifier core 1 includes several parallel cascode amplifier cells as previously explained in FIG. 2 and defined in part in U.S. Pat. No. 7,560,989 B2. Each cascode amplifier cell of the present invention is composed of at least two series connected NMOS transistors N1" and N2" connected between the earth terminal and the output terminal $PA_{OUT}$. A power controller PC 12 of the power amplifier circuit can preferably select a combination of cascode amplifier cells to activate. To do that, each cascode amplifier cell includes a third NMOS transistor N3" in a triode mounting with the two previous NMOS transistors N1" and N2". The output power is also reduced with the triode mounting of transistors of each cascode amplifier cell. Each third transistor N3", which can be considered only like a switch element, has its drain directly connected to the output terminal $PA_{OUT}$ and its source connected to the drain of the second NMOS transistor N2".

The desired power level is determined by a codeword, which defines the combination of cascode amplifier cells to be activated and adjustments of the current and voltage references if needed. In order to activate one cascode amplifier cell, the gate of the third transistor N3" is controlled by a high level voltage, for example to the battery voltage $V_{DD}$ not shown. Said battery voltage can be of the order of 3.5 V. For deactivating one cascode amplifier cell in triode mounting, the gate of the third NMOS transistor N3" is controlled by a low level voltage, for example 0 V. Each combination of activated amplifier cells defines a predetermined attenuation level of the power amplifier output signal, so that it may be attenuated in a stepwise manner according to the selected combination.

The first NMOS transistor N1" of each cascode amplifier cell, has its source connected to earth terminal, whereas its drain is connected to the source of the second NMOS transistor N2". All the gates of the first NMOS transistors N1" are provided to be controlled by an inverted carrier frequency signal, for example with a carrier frequency close to 434 MHz. For that, a phase locked loop (designated PLL) of the power amplifier circuit, not shown, is clocked by a clock signal CLK in order to provide in output of a voltage controlled oscillator, a carrier frequency signal RF_in. Said carrier frequency signal RF_in is inverted by an inverter 3 in order to supply the gates of the first NMOS transistors N1" with an inverted carrier frequency signal. The supply voltage of said inverter 3 is fixed by a regulator output voltage supplied by a first regulator 10 as explained above in reference to FIG. 1.

The second NMOS transistor N2" of each cascode amplifier cell, has its source connected to the drain of a first NMOS transistor N1", whereas its drain is connected to the source of a third NMOS transistor N3". All the gates of the second NMOS transistors N2" are controlled by a cascode gate voltage $V_{PA}$ at output of a smoothing control loop 5. The cascode gate voltage $V_{PA}$ is supplied for example through a multiplexer 4, which is controlled by a control signal $S_{\_ON}$. In a first state of said control signal, the voltage of all the gates of the second NMOS transistors N2" of the cascode amplifier cells is fixed to a high level voltage $V_{DD}$. In this condition, the edge data transition cannot be adapted by the smoothing control loop 5 and the current in the amplifier core is only dependent on the number of selected cascode amplifier cells. In a second state of said control signal, the voltage of all the gates of the second NMOS transistors N2" of the cascode amplifier cells is fixed by the cascode gate voltage $V_{PA}$ of the smoothing control loop 5. This extra NMOS transistor N2" inserted in each triode mounting amplifier cell is used to control the current in the amplifier core. In this mode each first NMOS transistor N1" acts more like a voltage controlled resistor and thus to limit the current which in turns limits the power at the antenna arrangement.

Said cascode gate voltage $V_{PA}$ is dependent on a current ramp $I_V$ provided by a smoothing ramp current generator 20 during each data transition as explained in more details below and shown on FIG. 4. For each edge data transition, the current ramp increases or decreases between a first current value and a second current value in order to adapt the time of transition from a data "0" to "1" or inversely. Preferably the first current value corresponds to the minimum current, which can be also 0 for an OOK modulation or $I_{min}$ for ASK modulation, and the second current value corresponds to the maximum current. Said time for edge transition can be programmed to best match the desired data rate. A good compromise is to have the edge transition time for example about 5, 10 or 20% of the period of data to achieve good spectral performance.

In particular with the smoothing control loop 5, the power amplifier circuit can operate if several cascode amplifier cells are used, by limiting the amount of current that can flow in the amplifier core 1 during each data edge that generates the ASK (amplitude shift keying) waveform. During a data "0" to "1" transition, the current flowing through the amplifier core 1 is gradually increased from a preset minimum value up to the preset maximum value. The opposite occurs during a data "1" to "0" transition as the current is gradually reduced back the preset minimum value or to 0 in the case of full on/off keying (OOK).

The smoothing control loop 5 includes an electronic arrangement similar to the regulator arrangement with a feedback loop around a replica presented on FIG. 1. So the smoothing control loop 5 includes a replica cascode amplifier cell, that is composed in particular of two series connected NMOS transistors N1' and N2', if the amplifier core 1 includes only one cascode amplifier cell, but preferably with a triode mounting NMOS transistors N1', N2' and N3' with an amplifier core 1 with several parallel cascode amplifier cells. Said replica cascode amplifier cell has to be similar to any of cascode amplifier cells of the amplifier core 1.

The current $I_V$ from the smoothing ramp current generator 20, is mirrored in the replica cascode amplifier cell by a current mirror. Said current mirror includes two PMOS transistors P1' and P2'. The sources of the two PMOS transistors are connected to the high level voltage $V_{DD}$. The gate and drain of the first PMOS transistor P1' are linked to receive the current $I_V$. The gate of the second PMOS transistor P2' is connected to the gate of the first PMOS transistor P1' through a low-pass filter LPF1 in order to attenuate the fluctuation due to stepwise current ramp $I_V$. The drain of the second PMOS transistor P2' is connected to the drain of the third NMOS transistor N3' and at one input of an operational trans-conductance amplifier (OTA) 10', which is similar to the regulator 10.

In the feedback loop around the replica, a comparison in the OTA 10' is carried out with a reference voltage $V_{Ref}$ provided by a voltage generator 11 connected to the power controller 12 as explained also in reference to FIG. 1. The output of the OTA 10', is connected to the gate of the second NMOS transistor N2' of the triode replica amplifier cell and through a second low-pass filter LPF2 to the gates of the second NMOS transistors N2" of the amplifier core 1. For that it is necessary to control multiplexer 4 by a control signal $S_{\_ON}$ in a second state. By monitoring and controlling the current, which can be $M \cdot I_V$ with an adequate coefficient M, through the replica cascode amplifier cell, a proportional current is to be expected to flow through selected cascode amplifier cells of the amplifier core 1. The gate of the first NMOS transistor N1', whose the source is connected to earth terminal, is controlled by the regulator output voltage of the regulator arrangement.

As explained in part above with FIG. 1 of prior art, the regulator arrangement includes for this embodiment a reference cascode replica 8, that is composed of triode mounting NMOS transistors N1, N2 and N3. The reference current $I_{Ref}$ is mirrored in the reference replica 8 by a current mirror 13 with two PMOS transistors P1 and P2, which are connected in similar manner to the current mirror of the smoothing control loop 5. The current $K \cdot I_{Ref}$ flowing through the replica cell 8 corresponds to the reference current $I_{Ref}$ mirrored in the current mirror 13 with an adequate coefficient K. In this embodiment, the current through replica cell 8 is a proportional current to be expected to flow through amplifier core 1, namely the cascode amplifier cells if the smoothing control loop is not in operation. A feedback circuit around the replica cell 8 is made as explained above for the smoothing control loop. This feedback loop comprises the voltage regulator 10, such as a reference voltage comparator or OTA, to fix the top voltage of replica cell 8 to a reference voltage provided by a voltage generator 11. The power controller 12 is used to adjust both the selected voltage reference and the selected current reference of the current generator 9. The reference current and the reference voltage are generated internally also using a band-gap reference BG_ref well known in this technical field.

The ramp of current $I_r$ received by the smoothing control loop 5 during each edge data transition from "0" to "1" or from "1" to "0", is provided via a smoothing ramp current generator 20 by stepwise addition or subtraction of current values of a plurality of current sources. As explained below, it can be generated by discrete steps in each generated edge transition, for example 32 discrete steps. These steps are generated by programmable divided down version of the system clock CLK. It is therefore possible to change the step duration by changing the clock period. An analogy of this operation is going up a step staircase on a "0" to "1" data transition and coming back down the staircase on the "1" to "0" transition. Each step up the staircase increases the amount of current allowed to flow in the amplifier core 1, while each step back down reduces the current of an equivalent amount. In this embodiment, each step controls a weighted current source of the smoothing ramp current generator 20. It can be provided to use three different current ramp types. The current ramps can be a linear current ramp, a raised cosine current ramp or a moving average current ramp.

For that the smoothing ramp current generator 20 can include several continuous current sources $I_{1a}$, $I_{1b}$, $I_{1c}$, $I_{2a}$, $I_{2b}$, $I_{2c}$, $I_{3a}$, $I_{3b}$, $I_{3c}$, $I_{32a}$, $I_{32b}$, $I_{32c}$. Said weighted currents are provided by being generated for example on the basis of the reference current $I_{Ref}$ mirrored in a complementary PMOS transistor not shown, connected in the current mirror 13. In this way these currents are proportional to the master current that sets the output power level. Several sets of three current sources are connected each to a respective multiplexer $MUX_1$, $MUX_2$, $MUX_3$, $MUX_{32}$ in order to select one of the current ramps to be used. In this embodiment, the number of multiplexers can be 32 multiplexers, with 32 sets of three current sources. However any number of multiplexers or current sources can be provided.

A ramp control signal $R_{ty}$, which is a 2-bit signal, is applied to each multiplexer in order to select one of the three current sources to connect to a respective switch element SW1, SW2, SW3, SW32. The number of switch elements is preferably equivalent to the number of multiplexers, for example 32 switch elements. The outputs of all the switch elements are together connected to the first PMOS transistor P1' of the current mirror of the smoothing control loop 5. The switch elements are controlled in particular successively in a closed or open state by a 32-bit shift register 2 during each edge data transition explained below.

Said shift register 2 is composed for example of 32 D-type flip-flops r1, r2, r3, r32 connected in series. The output Q of a flip-flop is connected to the input D of a subsequent flip-flop. The first D-type flip-flop receives at input D the data signal DATA for the ASK or OOK modulation on carrier frequency of RF signals to be transmitted, and is clocked by the clock signal CLK. The frequency of the clock signal can be of the order of 13.56 MHz. To achieve the fastest edge rate, both edges of the clock signal CLK are used. To do this the clock signal is inverted in a ramp inverter 6. So, all the odd flip-flops r1, r3, r5 to r31 are clocked by one edge of the clock signal CLK, whereas all the even flip-flops r2, r4, r6 to r32 are clocked by the other edge of the clock signal CLK inverted by the ramp inverter 6.

Therefore by adjusting the size of each current source the total allowed current in the power amplifier core 1 is the previous current +/− the current size of the next step. In this way a customized ramp can be generated, for example a linear ramp, a raised cosine ramp or a moving average ramp or another non linear type of ramp. For example a linear ramp is generated if each step contains the current source with a same current value. It is to be noted that this is linear in current and since the output power is proportional to current squared the power ramp will not be linear in the power amplifier core 1. It can be provided also in the smoothing ramp current generator 20, a current source or a resistor not shown in order to be directly connected to the first PMOS transistor P1' of the smoothing control loop 5 and to set a minimum current for ASK modulation.

As above-mentioned, the current implementation uses a 32-bit shift register 2 to control the current steps to limit the required amount of hardware. Additionally to achieve the fastest edge rate both edges of the clock are used. When a "1" to "0" transition occurs the "0" is clocked through the shift register 2 until all the 32 flip-flops finally have an output at a "0" state. When a "0" to "1" transition occurs a "1" is clocked through the shift register 2 until all the flip-flops have an output at a "1" state. After each data transition all the flip-flops stay at the "0" state to control a minimum current $I_r$, which can be 0 for an OOK modulation or $I_{min}$ for ASK modulation, or at the "1" state to control a maximum current $I_r$. A potential limitation of this architecture is that the current sources should be symmetrical about the middle of the shift register since the last register to turn on in one direction is the last register to shut off in the opposite direction and these should match to get symmetrical edge shaping. Obviously the register length and/or the symmetry requirements can be changed by using additional storage elements.

The power amplifier circuit includes in parallel to the smoothing ramp current generator 20, also a depth controller 21, which is connected to the output of said smoothing ramp current generator 20. The current in said depth controller is also generated on the basis of the reference current $I_{Ref}$ mirrored in a second complementary PMOS transistor not shown, connected in the current mirror 13. The depth controller 21 is controlled by a 3-bit word Mod_depth from a processor not shown. Said depth controller 21 can be used to set the minimum current level supplied by the output Cur-_Mag and therefore the minimum output power level in the power amplifier core 1 for a "0" state of ASK data modulation. The depth of modulation is generated by not starting step 0 at zero current, but rather at a current that represents the modulation depth for example a minimum current $I_{min}$, which can be at the first current value. So if the depth of modulation is fixed to 6 dB this means that the starting current is ½ of the final current instead of 0. So the smoothing depth controller modifies the 0 step current and the step current as required to set the modulation depth as selected. For a depth of modulation at 12 dB, the minimum current value corresponds to 0.25 of the full on current or maximum current.

In this embodiment, the ratios of the current sources can be corrected for full OOK modulation, in which the minimum current is 0, or different levels of ASK modulation. In the case of a selected linear current ramp configuration in particular for OOK modulation, each current source $I_{1a}$, $I_{2a}$, $I_{3a}$, $I_{32a}$ can be ¹⁄₃₂nd of the reference current such that when all flip-flops of the shift register 2 are at a "0" state, the current is zero and when flip-flops of the shift register are at "1" state, the current is equal to the reference current. Now if ASK modulation is desired, each current source is according to the formulae (reference current−minimum current)/32, where the minimum current represents the minimum output power setting. For 20 dB ASK modulation, the minimum current would be 0.1 times the reference current.

As previously mentioned since the flip-flops of the shift register 2, shift a "1" through for max power and a "0" for min power in the same sequence, the current weights should be symmetrical about the mid point of the shift register to guarantee symmetry in the RF output. Below is a chart of current source weights used to achieve three different ramp types. The specified values are given only to illustrate the current weight fluctuation for each step among the 32 provided steps x1 to x32 for generating the current ramp. However other values can be chosen depending on the dimensions of the MOS transistors used for the current mirrors and the cascode amplifier cells of the amplifier core 1 and the replica of the smoothing control loop 5.

In the below chart, the row A represents a moving average that is just an average of 4 successive previous samples for each of the 32 steps. The row B represents a raised cosine ramp that is similar except the weights are such to approximate $\frac{1}{2} - \cos((\text{step}/32) \cdot 180°)/2$. The row C represents a linear current ramp, which can be defined by the formulae $I_{Vn} = I_{V0} + n \cdot (I_{Vmax}/32)$ to vary between $I_{V0}$ and $I_{Vmax}$, and where the number n defines one of the 32 steps. The current value $I_{V0}$, which is the first current value, can be 0 or $I_{min}$ according to a minimum current value Cur_Mag supplied by the depth controller 21 or another current source or resistor of the smoothing ramp current generator 20. The maximum current value $I_{Vmax}$, which is the second current value, depends on the minimum current value $I_{min}$ added to the current of all selected current sources after the step x32 for data at the "1" state. The weights here are not $\frac{1}{32}$ because they represent MOS widths where the reference width is 119.68 or 32× of the value shown.

of data. Said current ramp $I_V$ is decreased step by step by each edge of the clock signal CLK for the data transition of "1" to "0" from the maximum current to the minimum current. The cascode gate voltage $V_{P4}$ increases or decreases as a function of the current ramp $I_V$ mirrored in the replica cascode amplifier cell of the smoothing control loop. However the cascode gate voltage $V_{P4}$ is not linear as the defined current ramp, but the time for passing from a "0" state to a "1" state or inversely in ASK data modulation is adapted by the cascode gate voltage of the second NMOS transistor in triode mounting of the amplifier core. The clock signal CLK is preferably applied only during each transition in order to reduce the consumption.

On the basis of the description just given, numerous variants of the power amplifier circuit can be designed by a person skilled in the art without departing from the scope of the invention as defined in the claims. The two low pass filters in the smoothing control loop can be adapted by a bit word supplied by a processor. Only one type of ramp can be chosen without all the multiplexers in the smoothing ramp current generator, but with the series of switch elements each connected to a respective current source. The amplifier core and replica cascode amplifier cells can be composed with other types of transistors, for example bipolar transistors or PMOS transistors or a combination of bipolar and MOS transistors.

What is claimed is:

1. A power amplifier circuit intended to be linked to an antenna arrangement of a communication system for transmission of ASK RF data signals, the power amplifier circuit comprising:

|   | x1 | x2 | x3 | x4 | x5 | x6 | x7 | x8 | x9 | x10 | x11 |
|---|----|----|----|----|----|----|----|----|----|-----|-----|
| A | 0.44 | 0.88 | 1.32 | 1.76 | 2.22 | 2.64 | 3.08 | 3.52 | 3.96 | 4.44 | 4.94 |
| B | 0.29 | 0.86 | 1.43 | 1.98 | 2.51 | 3.02 | 3.50 | 3.94 | 4.35 | 4.72 | 5.04 |
| C | 3.74 | 3.74 | 3.74 | 3.74 | 3.74 | 3.74 | 3.74 | 3.74 | 3.74 | 3.74 | 3.74 |

|   | x12 | x13 | x14 | x15 | x16 | x17 | x18 | x19 | x20 | x21 | x22 |
|---|-----|-----|-----|-----|-----|-----|-----|-----|-----|-----|-----|
| A | 5.28 | 5.72 | 6.16 | 6.60 | 7.04 | 7.04 | 6.60 | 6.16 | 5.72 | 5.28 | 4.94 |
| B | 5.31 | 5.53 | 5.70 | 5.81 | 5.87 | 5.87 | 5.81 | 5.70 | 5.53 | 5.31 | 5.04 |
| C | 3.74 | 3.74 | 3.74 | 3.74 | 3.74 | 3.74 | 3.74 | 3.74 | 3.74 | 3.74 | 3.74 |

|   | x23 | x24 | x25 | x26 | x27 | x28 | x29 | x30 | x31 | X32 |
|---|-----|-----|-----|-----|-----|-----|-----|-----|-----|-----|
| A | 4.44 | 3.96 | 3.52 | 3.08 | 2.64 | 2.22 | 1.76 | 1.32 | 0.88 | 0.44 |
| B | 4.72 | 4.35 | 3.94 | 3.50 | 3.02 | 2.51 | 1.98 | 1.43 | 0.86 | 0.29 |
| C | 3.74 | 3.74 | 3.74 | 3.74 | 3.74 | 3.74 | 3.74 | 3.74 | 3.74 | 3.74 |

Figure 4:
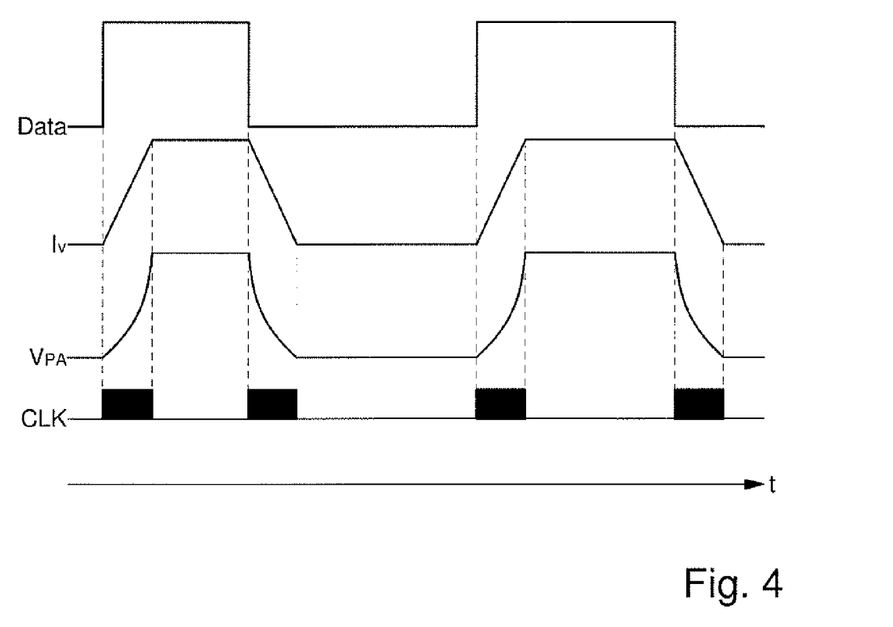
FIG. 4 shows a temporal diagram of signals in some parts of the power amplifier circuit of the present invention.

To explain more clearly the smoothing of the edge data transition, it can be shown in reference to FIG. 4, which represents temporal diagram of signals in some parts of the power amplifier circuit of the present invention.

Data signal DATA is introduced at input of the shift register and we note the data transition between the "0" state and the "1" state and inversely. The data rate can be chosen for example between 1 and 100 kbits/s. The time of data transition in the amplifier core depends on the current ramp $I_V$ generated by the smoothing ramp current generator. The current ramp shown in FIG. 4 is a linear current ramp. Said current ramp $I_V$ is increased step by step by each edge of the clock signal CLK for the data transition of "0" to "1" from a first current value, which can be 0 or a defined minimum current, to a second current value, which is a defined maximum current. The time of data transition can be programmed from less than 1% to over 20% of the period of data in very small steps to achieve good spectral performance. Preferably said time of data transition can be 5, 10 or 20% of the period an amplifier core with at least one cascode amplifier cell, wherein the cascode amplifier cell includes
(i) at least a first transistor and a second transistor
(ii) an output terminal that connects the amplifier core to the antenna arrangement; and
(iii) an earth terminal, wherein the first transistor and the second transistor are connected in series between the output terminal and the earth terminal;
wherein the first transistor of the cascode amplifier cell is controlled by a carrier frequency signal, wherein the second transistor of the cascode amplifier cell is controlled by a smoothing control loop in order to modulate data to be transmitted on carrier frequency by amplitude shift keying,
wherein the smoothing control loop generates a gate voltage for the second transistor on the basis of an increasing or decreasing current ramp from a first current value to a second current value during a data transition for shaping the envelope of ASK RF data signals to be transmitted.

2. The power amplifier circuit according to claim 1, wherein the amplifier core is comprised of a plurality of cascode amplifier cells, wherein each cascode amplifier cell includes the first transistor, the second transistor and a third transistor in triode mounting between the output terminal and the earth terminal, and wherein a gate of each third transistor is controlled by a power controller in order to select a combination of cascode amplifier cells to activate.

3. The power amplifier circuit according to claim 2, wherein each first transistor has a gate, and the gates of all the first transistors are connected together in order to be controlled by the carrier frequency signal, and wherein the gates of all the second transistors are connected together in order to be controlled by a gate voltage from the smoothing control loop.

4. The power amplifier circuit according to claim 3, wherein the gates of all the second transistors are controlled by the smoothing control loop through a multiplexer that is controlled by a control signal, in a first state of the control signal, the voltage of all the gates of the second transistors of the cascode amplifier cells being fixed to a high level voltage of a supply voltage source, whereas in a second state of the control signal, all the gates of the second transistors are controlled by the gate voltage from the smoothing control loop.

5. The power amplifier circuit according to claim 2, wherein the first transistor, the second transistor and the third transistor of each triode mounting cascode amplifier cell are NMOS transistors.

6. The power amplifier circuit according to claim 2, wherein the smoothing control loop includes a triode replica cell made of one cascode amplifier cell similar to those of the amplifier core, a current mirror that mirrors a current from a smoothing ramp current generator in the replica cascode amplifier cell, a voltage generator that provides a voltage reference to a voltage comparator or an operational trans-conductance amplifier, wherein the voltage comparator or the operational trans-conductance amplifier has another input that is connected to a drain of a third transistor of the replica cascode amplifier cell, and wherein the output of the voltage comparator or the operational trans-conductance amplifier being connected to a gate of the second transistor of the triode replica amplifier cell in order to control the gates of all the second transistors of the amplifier core.

7. The power amplifier circuit according to claim 6, wherein the current mirror is composed of two PMOS transistors, wherein the two PMOS transistors each have a source, and the sources of the two PMOS transistors are connected to a high level voltage of a supply voltage source, wherein a gate and a drain of the first PMOS transistor is linked to the smoothing ramp current generator to receive a current increasing or decreasing during each data transition, wherein a gate of the second PMOS transistor is connected to the gate of the first PMOS transistor through a first low-pass filter, wherein a drain of the second PMOS transistor is connected to the drain of the third transistor of the triode replica amplifier cell, and wherein the transistors of the triode replica amplifier cell are NMOS transistors.

8. The power amplifier circuit according to claim 6, wherein the gates of all the second transistors of the amplifier core are controlled by the output of the voltage comparator or the operational trans-conductance amplifier through a second low pass filter.

9. The power amplifier circuit according to claim 1, wherein the smoothing control loop generates an increasing gate voltage for the second transistor of the cascode amplifier cell depending on an increasing current ramp supplied by a smoothing ramp current generator from a first minimum current value to a second maximum current value during a data transition from a "0" state to "1" state, and wherein the smoothing control loop generates a decreasing gate voltage for the second transistor of the cascode amplifier cell depending on a current ramp decreasing supplied by the smoothing ramp current generator from the second maximum current value to the first minimum current value during a data transition from a "1" state to "0" state.

10. The power amplifier circuit according to claim 9, wherein the smoothing ramp current generator includes a plurality of current sources and a series of switch elements, wherein each switch element is linked to at least one respective current source, whereas outputs of all the switch elements are connected together to the smoothing control loop, and wherein the switch elements are arranged in order to be independently and successively controlled by a shift register, which is clocked by a clock signal, to pass in a closed or open state during each edge data transition for allowing the smoothing ramp current generator to generate a current ramp.

11. The power amplifier circuit according to claim 10, wherein the shift register is composed of a plurality of flip-flops connected in series, wherein an output of each flip-flop is connected to one respective switch element, wherein the first flip-flop is arranged to receive a data signal, for which the data transition in said data signal is transferred successively to the output from the first flip-flop to the last flip-flop by being clocked with the clock signal.

12. The power amplifier circuit according to claim 11, wherein all the odd flip-flops of the shift register are arranged to be clocked by the clock signal, whereas the even flip-flops of the shift register are arranged to be clocked by an inverted clock signal that is obtained on the basis of the clock signal through a ramp inverter.

13. The power amplifier circuit according to claim 10, wherein the number of current sources is equivalent to the number of switch elements.

14. The power amplifier circuit according to claim 10, wherein the smoothing ramp current generator is arranged to generate a current ramp during each edge data transition from the first minimum current value to the second maximum current or inversely with a time of data transition, wherein the time of data transition can be 5, 10 or 20% of the period of data in a data signal to be transmitted.

15. The power amplifier circuit according to claim 14, wherein the smoothing ramp current generator is arranged to generate a linear current ramp by successively adding or subtracting a similar current value of the current sources connected or disconnected at the output of the smoothing ramp current generator.

16. The power amplifier circuit according to claim 14, wherein the smoothing ramp current generator is arranged to generate a raised cosine current ramp or a moving average current ramp.

17. The power amplifier circuit according to claim 10, wherein a set of three current sources is connected to each switch element through a respective multiplexer, wherein the number of multiplexer is equivalent to the number of switch elements, and wherein all the multiplexers are controlled by a 2-bit ramp control signal in order to select one of the three current sources to be connected to the respective switch element and to allow the smoothing ramp current generator to supply at output a linear current ramp, a raised cosine current ramp or a moving average current ramp during each data transition.

18. The power amplifier circuit according to claim 9, wherein the power amplifier circuit includes a depth controller connected to the smoothing control loop and to the output of the smoothing ramp current generator for supplying a constant current to the smoothing control loop, said constant current being the first minimum current, and wherein the depth controller is controlled by a control bit word in order to adapt the current value of the first minimum current supplied to the smoothing control loop.

19. A method for implementing the power amplifier circuit, which comprises an amplifier core, which includes parallel cascode amplifier cells, a smoothing control loop in which is a replica cascode amplifier cell made similar to those of said amplifier core, and a smoothing ramp current generator to supply a current ramp to the smoothing control loop during each data transition, wherein the method comprises the steps of:

generating an increasing or decreasing current ramp in the smoothing ramp current generator during a data transition; and supplying the current ramp to the smoothing control loop, wherein the smoothing control loop is provided for generating a gate voltage for a second transistor of each cascode amplifier cells on the basis of the increasing or decreasing current ramp from a first current value to a second current value during the data transition for shaping the envelope of ASK RF data signals to be transmitted.

20. Method according to claim 19, wherein the time of data transition is adapted to be programmed from less than 1% to over 20% of the period of data in a data signal to be transmitted through the smoothing control loop on the basis of the current ramp received from the smoothing ramp current generator.

21. Method according to claim 19, wherein the smoothing ramp current generator generates a linear current ramp, a raised cosine current ramp or a moving average current ramp for supplying an increasing or decreasing current to the smoothing control loop during each data transition.

* * * * *